United States Patent
Ren et al.

(10) Patent No.: US 10,774,253 B2
(45) Date of Patent: Sep. 15, 2020

(54) FLEXIBLE SUBSTRATE, PRODUCTION METHOD OF FLEXIBLE SUBSTRATE, AND DISPLAY APPARATUS

(71) Applicants: BOE Technology Group Co., Ltd., Beijing (CN); Beijing BOE Display Technology Co., Ltd., Beijing (CN)

(72) Inventors: Jinyu Ren, Beijing (CN); Yongzhi Song, Beijing (CN); Xiangyu Cheng, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 40 days.

(21) Appl. No.: 15/973,948

(22) Filed: May 8, 2018

(65) Prior Publication Data
US 2019/0161664 A1    May 30, 2019

(30) Foreign Application Priority Data
Nov. 27, 2017   (CN) .......................... 2017 1 1209073

(51) Int. Cl.
  *C09K 5/06*   (2006.01)
  *B32B 27/18*   (2006.01)
  *B32B 27/28*   (2006.01)
  *H01L 51/00*   (2006.01)
  *H01L 51/52*   (2006.01)

(52) U.S. Cl.
  CPC .............. *C09K 5/063* (2013.01); *B32B 27/18* (2013.01); *B32B 27/285* (2013.01); *H01L 51/0097* (2013.01); *B32B 2307/30* (2013.01); *B32B 2307/702* (2013.01); *B32B 2307/704* (2013.01); *B32B 2457/206* (2013.01); *H01L 51/529* (2013.01)

(58) Field of Classification Search
None
See application file for complete search history.

(56) References Cited

U.S. PATENT DOCUMENTS

| | | | |
|---|---|---|---|
| 6,077,597 A | 6/2000 | Pause | |
| 8,221,910 B2* | 7/2012 | Hartmann | ............... C08B 15/02 |
| | | | 428/507 |
| 8,673,448 B2* | 3/2014 | Hartmann | ............... C08F 20/32 |
| | | | 428/411.1 |
| 2010/0016513 A1* | 1/2010 | Hartmann | ................. C08F 8/14 |
| | | | 525/327.3 |
| 2014/0370354 A1* | 12/2014 | Yang | ................... H01M 10/625 |
| | | | 429/120 |
| 2017/0062480 A1 | 3/2017 | Li | |

FOREIGN PATENT DOCUMENTS

| | | |
|---|---|---|
| CN | 104733479 A | 6/2015 |
| CN | 106168714 A | 11/2016 |
| CN | 106601756 A | 4/2017 |

OTHER PUBLICATIONS

First Office Action, including Search Report, for Chinese Patent Application No. 201711209073.1, dated Nov. 12, 2019, 14 pages.

* cited by examiner

*Primary Examiner* — Sheeba Ahmed
(74) *Attorney, Agent, or Firm* — Westman, Champlin & Koehler, P.A.

(57) ABSTRACT

This disclosure provides a flexible substrate, a production method of a flexible substrate, and a display apparatus. The flexible substrate comprises a flexible base and a flexible thin film, and the flexible thin film adheres to the flexible base. The flexible thin film is used to absorb and store heat when the temperature of the flexible base is higher than a first threshold temperature and to release heat when the temperature of the flexible base is lower than a second threshold temperature so as to adjust the temperature of the flexible base.

16 Claims, 1 Drawing Sheet

FLEXIBLE SUBSTRATE, PRODUCTION METHOD OF FLEXIBLE SUBSTRATE, AND DISPLAY APPARATUS

CROSS-REFERENCE TO RELATED APPLICATION

This application claims priority benefits from Chinese Application No. 201711209073.1 filed on Nov. 27, 2017, the entire contents of which are hereby incorporated by reference.

FIELD OF THE INVENTION

This disclosure relates to the technical field of display, and particularly to a flexible substrate, a production method of a flexible substrate, and a display apparatus.

BACKGROUND OF THE INVENTION

With the development of display techniques, flexible displays are more and more favored by users. A flexible display apparatus, which is produced from a soft material, is a deformable and bendable display. In the existing flexible displays such as OLEDs (organic light-emitting diodes), etc., polyimide or another organic flexible material is often used as a flexible substrate, and a display device is produced on this substrate.

SUMMARY OF THE INVENTION

This disclosure provides a flexible substrate, a production method of a flexible substrate, and a display apparatus.

Specifically, this disclosure provides a flexible substrate, comprising:
a flexible base; and
a flexible thin film, which adheres to the flexible base,
wherein the flexible thin film absorbs and stores heat when a temperature of the flexible base is higher than a first threshold temperature and releases heat when the temperature of the flexible base is lower than a second threshold temperature so as to adjust the temperature of the flexible base.

Optionally, the flexible thin film comprises a solid-solid phase change material, which has a first phase absorbing and storing heat when the temperature of the flexible base is higher than the first threshold temperature and has a second phase releasing heat when the temperature of the flexible base is lower than the second threshold temperature.

Optionally, the solid-solid phase change material further has a mixed phase of the first phase and the second phase when the temperature of the flexible base is between the first threshold temperature and the second threshold temperature.

Optionally, the solid-solid phase change material is at least one selected from the group consisting of a copolymer of polyethylene glycol and cellulose diacetate, a polyol material, and an inorganic salt material.

Optionally, the copolymer of polyethylene glycol and cellulose diacetate is a copolymer having a cellulose diacetate backbone and a polyethylene glycol branch chain.

Optionally, a first phase of the copolymer of polyethylene glycol and cellulose diacetate is a crystalline state, and a second phase of the copolymer of polyethylene glycol and cellulose diacetate is an amorphous state.

Optionally, the flexible thin film is composed of the solid-solid phase change material.

Optionally, the polyol material is at least one selected from the group consisting of pentaerythritol, neopentyl glycol, and dimethylol ethane.

Optionally, the inorganic salt material is at least one selected from the group consisting of layered perovskite, ammonium thiocyanate, lithium sulfate, and potassium bifluoride.

Optionally, the flexible thin film adheres to a bottom surface of the flexible base.

Optionally, the first threshold temperature is higher than or equal to the second threshold temperature.

Optionally, the first threshold temperature is in a range of 5-100° C.

Additionally, this disclosure further provides a production method of a flexible substrate, comprising the steps of:
producing a flexible thin film, wherein the flexible thin film absorbs and stores heat when a temperature of a flexible base is higher than a first threshold temperature and releases heat when the temperature of the flexible base is lower than a second threshold temperature; and
allowing the flexible thin film to adhere to the flexible base so as to adjust the temperature of the flexible base.

Optionally, the flexible thin film comprises a solid-solid phase change material, which has a first phase absorbing and storing heat when the temperature of the flexible base is higher than the first threshold temperature and has a second phase releasing heat when the temperature of the flexible base is lower than the second threshold temperature.

Optionally, the solid-solid phase change material further has a mixed phase of the first phase and the second phase when the temperature of the flexible base is between the first threshold temperature and the second threshold temperature.

Optionally, the solid-solid phase change material is at least one selected from the group consisting of a copolymer of polyethylene glycol and cellulose diacetate, a polyol material, and an inorganic salt material.

Optionally, the copolymer of polyethylene glycol and cellulose diacetate is a copolymer having a cellulose diacetate backbone and a polyethylene glycol branch chain.

Optionally, a first phase of the copolymer of polyethylene glycol and cellulose diacetate is a crystalline state, and a second phase of the copolymer of polyethylene glycol and cellulose diacetate is an amorphous state.

Optionally, the flexible thin film is composed of the solid-solid phase change material.

Optionally, the polyol material is at least one selected from the group consisting of pentaerythritol, neopentyl glycol, and dimethylol ethane.

Optionally, the inorganic salt material is at least one selected from the group consisting of layered perovskite, ammonium thiocyanate, lithium sulfate, and potassium bifluoride.

Optionally, the flexible thin film adheres to a bottom surface of the flexible base.

Optionally, the first threshold temperature is higher than or equal to the second threshold temperature.

Optionally, the first threshold temperature is in a range of 5-100° C.

Furthermore, this disclosure further provides a display apparatus, comprising the flexible substrate described above.

DETAILED DESCRIPTION OF THE INVENTION

In order to enable the objects, features, and advantages of this disclosure described above to be more remarkably and easily understood, this disclosure will be further illustrated in detail below in conjunction with accompanying drawings and specific embodiments.

When the ambient temperature decreases, the flexibility of the flexible substrate of the flexible display deteriorates and the hardness increases. The display device will be easily damaged when bent at this point. Otherwise, the flexible display may normally display at normal temperature when produced into a bent shape, but the substrate hardens and the internal stress of the substrate becomes larger at low temperatures, also resulting in damage of the display device.

Specifically, this disclosure provides a flexible substrate, comprising:

a flexible base; and a flexible thin film, which adheres to the flexible base, wherein the flexible thin film absorbs and stores heat when a temperature of the flexible base is higher than a first threshold temperature and releases heat when the temperature of the flexible base is lower than a second threshold temperature so as to adjust the temperature of the flexible base.

Figure 1:
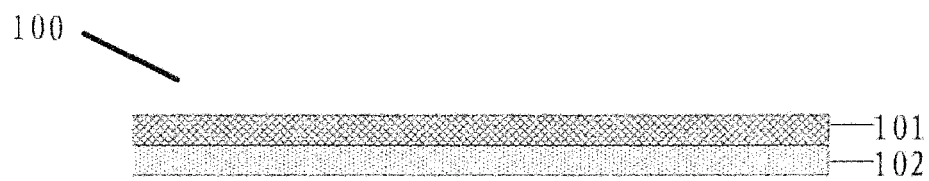
FIG. 1 shows a first structural schematic diagram of a flexible substrate in an exemplary embodiment of this disclosure.

FIG. 1 shows a first structural schematic diagram of a flexible substrate in an exemplary embodiment of this disclosure.

With reference to FIG. 1, there is shown a flexible substrate 100 of an embodiment of this disclosure. The flexible substrate 100 comprises a flexible base 101 and a flexible thin film 102, and the flexible thin film 102 adheres to the bottom surface of the flexible base 101.

The flexible thin film 102 is used to absorb and store heat when the temperature of the flexible base 101 is higher than a first threshold temperature and to release heat when the temperature of the flexible base is lower than a second threshold temperature so as to adjust the temperature of the flexible base 101.

In this embodiment, the flexible substrate 100 comprises the flexible base 101 and the flexible thin film 102 adhering to the bottom surface of the flexible base 101.

Figure 2:
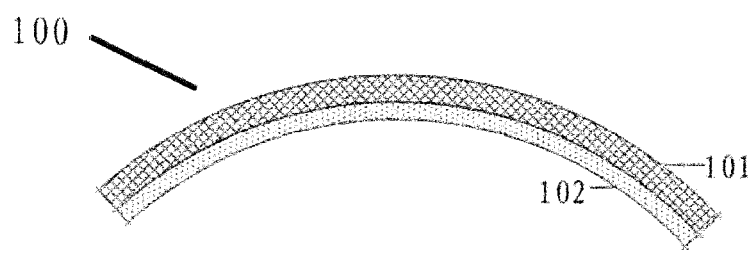
FIG. 2 shows a second structural schematic diagram of a flexible substrate in an exemplary embodiment of this disclosure.

FIG. 2 shows a second structural schematic diagram of a flexible substrate in an exemplary embodiment of this disclosure.

With reference to the flexible substrate 100 as shown in FIG. 2, the flexible substrate 100 may also be produced into a bent shape. This is not limited in detail in embodiments of this disclosure, and may be set according to practical situations.

The flexible thin film 102 absorbs and stores heat when the temperature of the flexible base 101 is higher than a first threshold temperature and releases heat when the temperature of the flexible base 101 is lower than a second threshold temperature. For example, the flexible thin film 102 absorbs and stores heat when the temperature of the flexible base 101 is higher than 18° C.; and the flexible thin film 102 releases heat when the temperature of the flexible base is lower than 13° C. The first threshold temperature and the second threshold temperature may be the same, or may be different. Optionally, the first threshold temperature is higher than or equal to the second threshold temperature. Furthermore, optionally, the first threshold temperature is in a range of 5-100° C. The first threshold temperature and the second threshold temperature are not limited in detail in embodiments of this disclosure, and may be set according to practical situations. The flexible thin film 102 releases heat when the temperature of the flexible base 101 is lower than the second threshold temperature. The heat released by the flexible thin film 102 is conducted to the flexible base 101 to adjust the temperature of the flexible base 101, so that the flexibility of the flexible base 101 may be maintained. The deterioration of the flexibility of the flexible base 101 and resultant hardening and easy damage of the flexible base are prevented, when the temperature of the flexible base is very low. The thickness of the flexible thin film is not limited in detail in embodiments of this disclosure, and may be set according to practical situations.

Optionally, the flexible thin film 102 is a solid-solid phase change material, which has a first phase absorbing and storing heat when the temperature of the flexible base is higher than the first threshold temperature and has a second phase releasing heat when the temperature of the flexible base is lower than the second threshold temperature. Furthermore, the solid-solid phase change material further has a mixed phase of the first phase and the second phase when the temperature of the flexible base is between the first threshold temperature and the second threshold temperature.

In this embodiment, the flexible thin film 102 is a solid-solid phase change material, and the solid-solid phase change material is in different phases when the temperature of the flexible base is higher than the first threshold temperature and when it is lower than the second threshold temperature. Specifically, the solid-solid phase change material is a first phase absorbing and storing heat when the temperature of the flexible base is higher than the first threshold temperature, the solid-solid phase change material is converted to a second phase releasing heat when the temperature of the flexible base is lower than the second threshold temperature, and the solid-solid phase change material is a mixed phase of the first phase and the second phase when the temperature is between the first threshold temperature and the second threshold temperature. The solid-solid phase change material has various advantages. For example, the solid-solid phase change material is a solid, which is easily processable and may be directly processed and molded; the expansion coefficient of phase change and the volumetric change are small; there is no phenomenon of excessive cooling or phase separation; the performance is stable and the useful life is long; and there is no toxicity, corrosion, or pollution.

Optionally, the flexible thin film is composed of the solid-solid phase change material.

Optionally, the solid-solid phase change material is at least one selected from the group consisting of a copolymer of polyethylene glycol and cellulose diacetate, a polyol material, and an inorganic salt material.

Optionally, a first phase of the copolymer of polyethylene glycol and cellulose diacetate is a crystalline state, and a second phase of the copolymer of polyethylene glycol and cellulose diacetate is an amorphous state.

In this embodiment, with a rigid cellulose diacetate (CDA) chain as a backbone and polyethylene glycol (PEG) flexible chain segments as branches, a reticular energy-storing material having solid-solid phase changing properties may be obtained, which is a copolymer of polyethylene glycol and cellulose diacetate having a cellulose diacetate backbone and polyethylene glycol branch chains (CDA-PEG). This material has a phase change initiation temperature of 16.6° C. and a phase change termination temperature of 46.6° C. CDA-PEG is a first phase, which is a crystalline state, absorbing and storing heat, when the temperature of the flexible base is higher than 16.6° C.; and CDA-PEG releases heat and is converted to a second phase, which is an amorphous state, releasing heat, when the temperature of the flexible base is lower than 16.6° C.

Optionally, the polyol is at least one selected from the group consisting of pentaerythritol (PE), neopentyl glycol (NPG), and dimethylol ethane.

Optionally, the inorganic salt is at least one selected from the group consisting of layered perovskite, ammonium thiocyanate ($NH_4SCN$), lithium sulfate ($LiSO_4$), and potassium bifluoride ($KHF_2$).

In summary, in embodiments of this disclosure, the flexible substrate comprises a flexible base and a flexible thin film. The flexible thin film absorbs and stores heat when the temperature of a flexible base is higher than a first threshold temperature and releases heat when the temperature of the flexible base is lower than a second threshold temperature. The flexible thin film releases heat when the temperature of the flexible base is lower than the second threshold temperature, so that the flexibility of the flexible base may be maintained. The deterioration of the flexibility of the flexible base caused by low temperature and resultant hardening and easy damage of the flexible base are prevented.

Figure 3:
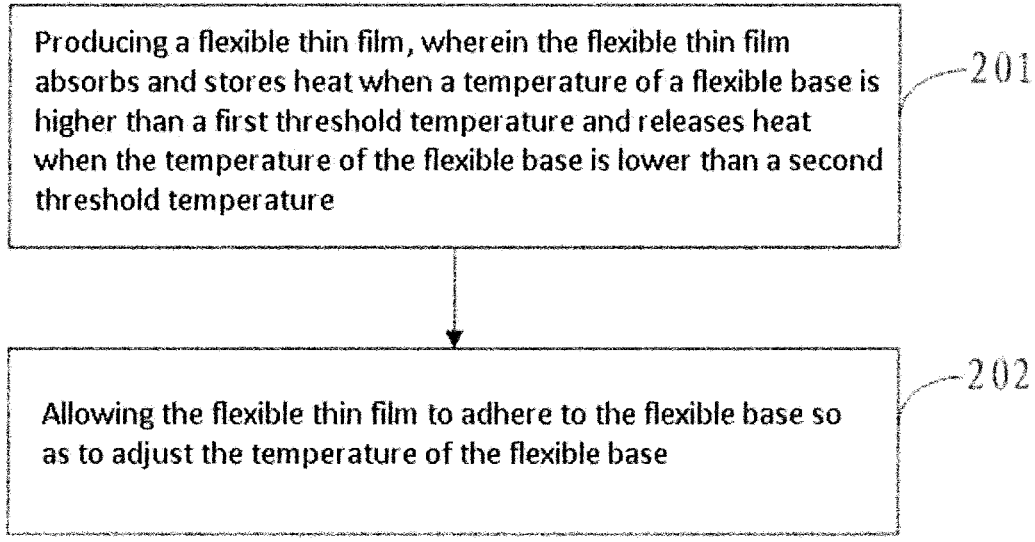
FIG. 3 shows a flow chart of the production method of a flexible substrate in another exemplary embodiment of this disclosure.

FIG. 3 shows a flow chart of the production method of a flexible substrate in another exemplary embodiment of this disclosure.

With reference to FIG. 3, the method comprises the steps of:

Step 201, producing a flexible thin film, wherein the flexible thin film absorbs and stores heat when a temperature of a flexible base is higher than a first threshold temperature and releases heat when the temperature of the flexible base is lower than a second threshold temperature.

In this embodiment, the flexible thin film 102 is a solid-solid phase change material, which is a first phase when the temperature of the flexible base 101 is higher than the first threshold temperature, is a second phase when the temperature of the flexible base 101 is lower than the second threshold temperature, and is a mixed phase of the first phase and the second phase when the temperature of the flexible base 101 is between the first threshold temperature and the second threshold temperature. Optionally, the solid-solid phase change material is at least one selected from the group consisting of a copolymer of polyethylene glycol and cellulose diacetate, a polyol material, and an inorganic salt material. Specifically, a copolymer of polyethylene glycol and cellulose diacetate may be used alone to produce the flexible thin film 102, or a copolymer of polyethylene glycol and cellulose diacetate may also be mixed with a flexible resin material to produce the flexible thin film 102. This is not limited in detail in embodiments of this disclosure, and may be selected according to practical situations. The flexible resin material may be at least one of polyimide and acrylate resins.

Step 202, allowing the flexible thin film to adhere to the flexible base so as to adjust the temperature of the flexible base.

In this embodiment, after the production of the flexible thin film 102 is finished, the flexible thin film 102 is allowed to adhere to the bottom surface of the flexible base 101. The manner of adhesion is not limited in detail in embodiments of this disclosure, and may be selected according to practical situations. The flexible thin film 102 releases heat when the temperature of the flexible base 101 is lower than the second threshold temperature so as to adjust the temperature of the flexible base 101, so that the flexibility of the flexible base 101 may be maintained and hardening and damage are prevented.

In summary, in the embodiments of this disclosure, a flexible thin film is produced, wherein the flexible thin film absorbs and stores heat when the temperature of a flexible base is higher than a first threshold temperature and releases heat when the temperature of the flexible base is lower than a second threshold temperature; and the flexible thin film is allowed to adhere to the bottom surface of the flexible base so as to adjust the temperature of the flexible base. The deterioration of the flexibility of the flexible base caused by low temperature and resultant hardening and easy damage of the flexible base are prevented.

An embodiment of this disclosure provides a display apparatus. This display apparatus comprises the flexible substrate of the embodiment as shown in FIG. 1.

The flexible substrate 100 comprises a flexible base 101 and a flexible thin film 102, and the flexible thin film 102 adheres to the bottom surface of the flexible base 101.

The flexible thin film 102 is used to absorb and store heat when the temperature of the flexible base 101 is higher than a first threshold temperature and to release heat when the temperature of the flexible base 101 is lower than a second threshold temperature so as to adjust the temperature of the flexible base 101.

In summary, in embodiments of this disclosure, the display apparatus comprises a flexible substrate, which comprises a flexible base and a flexible thin film, wherein the flexible thin film absorbs and stores heat when the temperature of a flexible base is higher than a first threshold temperature and releases heat when the temperature of the flexible base is lower than a second threshold temperature. The flexible thin film releases heat when the temperature of the flexible base is lower than the second threshold temperature to adjust the temperature of the flexible base, so that the flexibility of the flexible base may be maintained. The deterioration of the flexibility of the flexible base caused by low temperature and resultant hardening and easy damage of the flexible base are prevented.

Various embodiments in this specification are all described in a progressive manner. Each of the embodiments emphatically illustrates those different from other embodiments, and the same or similar parts between embodiments can be referred to each other.

Finally, it is to be further indicated that the relational terms such as first, second, and the like are merely to distinguish one entity or operation from another entity or operation, and it does not necessarily require or imply that there is any actual relation or order between these entities and operations. Additionally, the terms "include", "comprise", or any other variants, intends to cover nonexclusive inclusion, such that a process, method, merchandise, or device comprising a range of elements comprises not only those elements, but also other elements which are not specifically listed or elements intrinsically possessed by this process, method, merchandise, or device. In absence of more limitations, an element defined by a sentence "comprise a" does not exclude that there is additionally the same element in a process, method, merchandise, or device comprising this element.

A flexible substrate, a production method of a flexible substrate, and a display apparatus provided by this disclosure are introduced in detail above. The principles and embodiments of this disclosure are elaborated herein by using specific embodiments, and the description of the above embodiments is only used to help the understanding of the method of this disclosure and the core idea thereof. At the meanwhile, with respect to those of ordinary skill in the art, modifications will be made to specific embodiments and application ranges according to the idea of this disclosure. In summary, the contents of this specification should not be construed as limiting this disclosure.

What is claimed is:

1. A flexible substrate, comprising:
a flexible base; and
a flexible thin film, which adheres to the flexible base,
wherein the flexible thin film absorbs and stores heat when a temperature of the flexible base is higher than a first threshold temperature and releases heat when the temperature of the flexible base is lower than a second threshold temperature so as to adjust the temperature of the flexible base,
the flexible thin film comprises a solid-solid phase change material, which has a first phase absorbing and storing heat when the temperature of the flexible base is higher than the first threshold temperature and has a second phase releasing heat when the temperature of the flexible base is lower than the second threshold temperature, and
the solid-solid phase change material is at least one selected from the group consisting of a copolymer of polyethylene glycol and cellulose diacetate, a polyol material, and an inorganic salt material.

2. The flexible substrate according to claim 1, wherein the solid-solid phase change material further has a mixed phase of the first phase and the second phase when the temperature of the flexible base is between the first threshold temperature and the second threshold temperature.

3. The flexible substrate according to claim 1, wherein the copolymer of polyethylene glycol and cellulose diacetate is a copolymer having a cellulose diacetate backbone and a polyethylene glycol branch chain.

4. The flexible substrate according to claim 3, wherein a first phase of the copolymer of polyethylene glycol and cellulose diacetate is a crystalline state, and a second phase of the copolymer of polyethylene glycol and cellulose diacetate is an amorphous state.

5. The flexible substrate according to claim 1, wherein the flexible thin film is composed of the solid-solid phase change material.

6. The flexible substrate according to claim 1, wherein the polyol material is at least one selected from the group consisting of pentaerythritol, neopentyl glycol, and dimethylol ethane.

7. The flexible substrate according to claim 1, wherein the inorganic salt material is at least one selected from the group consisting of layered perovskite, ammonium thiocyanate, lithium sulfate, and potassium bifluoride.

8. The flexible substrate according to claim 1, wherein the flexible thin film adheres to a bottom surface of the flexible base.

9. The flexible substrate according to claim 1, wherein the first threshold temperature is higher than or equal to the second threshold temperature.

10. The flexible substrate according to claim 1, wherein the first threshold temperature is in a range of 5-100° C.

11. A production method of a flexible substrate, comprising the steps of:
producing a flexible thin film, wherein the flexible thin film absorbs and stores heat when a temperature of a flexible base is higher than a first threshold temperature and releases heat when the temperature of the flexible base is lower than a second threshold temperature; and
allowing the flexible thin film to adhere to the flexible base so as to adjust the temperature of the flexible base,
wherein the flexible thin film comprises a solid-solid phase change material, which has a first phase absorbing and storing heat when the temperature of the flexible base is higher than the first threshold temperature and has a second phase releasing heat when the temperature of the flexible base is lower than the second threshold temperature, and
the solid-solid phase change material is at least one selected from the group consisting of a copolymer of polyethylene glycol and cellulose diacetate, a polyol material, and an inorganic salt material.

12. The method according to claim 11, wherein the solid-solid phase change material further has a mixed phase of the first phase and the second phase when the temperature of the flexible base is between the first threshold temperature and the second threshold temperature.

13. The method according to claim 11, wherein the copolymer of polyethylene glycol and cellulose diacetate is a copolymer having a cellulose diacetate backbone and a polyethylene glycol branch chain.

14. The method according to claim 11, wherein a first phase of the copolymer of polyethylene glycol and cellulose diacetate is a crystalline state, and a second phase of the copolymer of polyethylene glycol and cellulose diacetate is an amorphous state.

15. The method according to claim 11, wherein the flexible thin film is composed of the solid-solid phase change material.

16. A display apparatus, comprising the flexible substrate of claim 1.

* * * * *